(12) United States Patent
Li et al.

(10) Patent No.: US 11,742,468 B2
(45) Date of Patent: Aug. 29, 2023

(54) LED DISPLAY MODULE AND LED DISPLAYER

(71) Applicant: Ledman Optoelectronic Co., Ltd., Shenzhen (CN)

(72) Inventors: Mantie Li, Shenzhen (CN); Junxue Zhu, Shenzhen (CN); Yuanting Xue, Shenzhen (CN); Daohua Huang, Shenzhen (CN)

(73) Assignee: Ledman Optoelectronic Co., Ltd., Shenzhen (CN)

( * ) Notice: Subject to any disclaimer, the term of this patent is extended or adjusted under 35 U.S.C. 154(b) by 438 days.

(21) Appl. No.: 16/954,271

(22) PCT Filed: Jan. 5, 2018

(86) PCT No.: PCT/CN2018/071601
§ 371 (c)(1),
(2) Date: Jun. 16, 2020

(87) PCT Pub. No.: WO2019/134127
PCT Pub. Date: Jul. 11, 2019

(65) Prior Publication Data
US 2021/0091282 A1    Mar. 25, 2021

(51) Int. Cl.
*H01L 33/62* (2010.01)
*G09F 9/33* (2006.01)
(Continued)

(52) U.S. Cl.
CPC ............... *H01L 33/62* (2013.01); *G09F 9/33* (2013.01); *H01L 27/156* (2013.01); *H01L 33/486* (2013.01); *H01L 33/642* (2013.01)

(58) Field of Classification Search
CPC combination set(s) only.
See application file for complete search history.

(56) References Cited

U.S. PATENT DOCUMENTS

| 6,169,632 | B1* | 1/2001 | Kurtenbach | G09F 9/33 359/620 |
| 2008/0078733 | A1* | 4/2008 | Nearman | G09F 9/3026 211/189 |
| 2014/0145675 | A1* | 5/2014 | Shimizu | H04B 5/0031 320/108 |

FOREIGN PATENT DOCUMENTS

| CN | 102968933 A | 3/2013 |
| CN | 103177665 A | 6/2013 |

(Continued)

OTHER PUBLICATIONS

International Search Report issued in corresponding PCT Application No. PCT/CN2018/071601, dated Sep. 27, 2018.

(Continued)

*Primary Examiner* — Ratisha Mehta
(74) *Attorney, Agent, or Firm* — Westbridge IP LLC

(57) ABSTRACT

An LED display module and an LED displayer are disclosed. The LED display module comprises a module bottom shell and a circuit board installed in the module bottom shell. The module bottom shell comprises a shell body and a first heat-dissipation cover disposed over a first open region of the shell body. The LED display module further comprises a power supply and a receiving card which are electrically connected to the circuit board. The power supply is located between the first heat-dissipation cover and the circuit board. The receiving card is located between the shell body and the circuit board. The LED display module is ultra-thin, and the LED displayer is made ultra-thin, accordingly.

19 Claims, 5 Drawing Sheets

(51) Int. Cl.
    *H01L 27/15*   (2006.01)
    *H01L 33/48*   (2010.01)
    *H01L 33/64*   (2010.01)

(56) References Cited

FOREIGN PATENT DOCUMENTS

| CN | 105427755 A | | 3/2016 | |
|---|---|---|---|---|
| CN | 106548714 A | * | 3/2017 | ............... G09F 9/33 |
| CN | 106548714 A | | 3/2017 | |
| CN | 107072089 A | | 8/2017 | |
| CN | 207781101 U | | 8/2018 | |

OTHER PUBLICATIONS

Office Action issued in counterpart Canadian Patent Application No. 3,086,052, dated Jul. 8, 2021.

* cited by examiner

LED DISPLAY MODULE AND LED DISPLAYER

TECHNICAL FIELD

The invention relates to the technical field of LED display, in particular to an LED display module and an LED displayer.

BACKGROUND

LED displayers, as flat-panel displayers, are used to display characters, images, videos, video signals and other information. The LED displayers typically comprise a case and multiple LED display modules installed on the case, wherein a control box is disposed on the back side of the case, and a power supply and a receiving card are disposed in the control box and are shared by the multiple LED display modules. However, due to the thickness superposition of the LED display modules, the case and the control box, the LED displayers have a large thickness and cannot fulfill ultra-thin design.

SUMMARY

The primary objective of the invention is to provide an LED display module to realize ultra-thin design of LED display modules and LED displayers.

To fulfill the aforesaid objective, the invention provides an LED display module, which comprises a module bottom shell and a circuit board installed in the module bottom shell, wherein the module bottom shell comprises a shell body and a first heat-dissipation cover disposed over a first open region of the shell body; and the LED display module further comprises a power supply and a receiving card which are electrically connected to the circuit board, wherein the power supply is located between the first heat-dissipation cover and the circuit board, and the receiving card is located between the shell body and the circuit board.

Preferably, a first wire slot and a second wire slot which extend downwards and are spaced from each other are formed in the outer surface of the lower side of the first open region of the module bottom shell, a third wire slot and a fourth wire slot which extend upwards and are spaced from each other are formed in the outer surface of the upper side of the first open region of the module bottom shell, the first wire slot and the third wire slot vertically correspond to each other, and the second wire slot and the fourth wire slot vertically correspond to each other; and the module bottom shell further comprises a first seal ring disposed between the first heat-dissipation cover and the periphery of the first open region, and the lower side of the first seal ring is hollowed out to make room for the first wire slot and the second wire slot.

Preferably, a first signal connector and a second signal connector which are electrically connected to the receiving card are disposed on the circuit board, one of the two signal connectors is used for inputting a signal, and the other one of the two signal connectors is used for outputting a signal; and/or, a first power connector and a second power connector which are electrically connected to the power supply are disposed on the circuit board, one of the two power connectors is used for inputting power, and the other one of the two power connectors is used for outputting power.

Preferably, the first signal connector and the second signal connector are arranged side by side in a vertical direction and correspond to the first wire slot.

Preferably, the first power connector and the second power connector are arranged side by side in a vertical direction and correspond to the second wire slot.

Preferably, the module bottom shell further comprises a second heat-dissipation cover, the shell body has a second open region corresponding to the second heat-dissipation cover, the second heat-dissipation cover is disposed over the second open region, and the receiving card is located between the second heat-dissipation cover and the circuit board.

Preferably, the LED display module further comprises a second seal ring which is disposed between the second heat-dissipation cover and the periphery of the second open region.

Preferably, the power supply is installed on the circuit board by welding or through a connector.

Preferably, the receiving card is installed on the circuit board by welding or through a connector.

Preferably, multiple magnetic parts are disposed on the outer surface of the module bottom shell and are used to install the LED display module on a case by means of magnetic attraction; and/or, multiple press locks are disposed on the outer surface of the module bottom shell and are used to install the LED display module on the case.

Preferably, the LED display module further comprises surface covers disposed on a side, backing onto the module bottom shell, of the circuit board, and the thickness of the LED display module is 8 mm-50 mm and is equal to the vertical distance from the top of each surface cover to the outer surface of the first heat-dissipation cover.

Preferably, the power supply is a DC-DC power supply for reducing a DC voltage, or an AC-DC power supply for switching an AC voltage into a DC voltage.

The invention further provides an LED displayer which comprises a case and at least two LED display modules which are installed on the case and assembled together, wherein each LED display module is the LED display module mentioned above.

Preferably, the power supplies are DC-DC power supplies for reducing DC voltages; and the LED displayer further comprises a switching power supply for switching an AC voltage into a DC voltage, and the switching power supply is electrically connected to the power supplies of all the LED display modules.

Preferably, the power supplies are AC-DC power supplies for switching AC voltages into DC voltages, and the power supply of each LED display module is accessed to a mains supply.

According to the technical solution of the invention, the power supply and the receiving card are integrated in one LED display module, that is, each LED display module has a power supply and a receiving card therein, so that the LED display module is made ultra-thin, and the LED displayer is made ultra-thin, accordingly; and in addition, the first heat-dissipation cover corresponds to the power supply, thus facilitating heat dissipation of the power supply.

BRIEF DESCRIPTION OF DRAWINGS

To more clearly explain the technical solutions of the embodiments of the invention or the prior art, the drawings required for the description of the embodiments or the prior art are brief introduced below. Obviously, the drawings in the following description are only for some embodiments of the invention, and those commonly skilled in the art can obtain other drawings according to the following ones without creative labor.

The implementations of objectives, functional characteristics and advantages of the invention will be further expounded hereinafter with reference to the accompanying drawings.

DETAILED DESCRIPTION OF THE EMBODIMENTS

The technical solutions of the embodiments of the invention are clearly and completely described below in conjunction with the accompanying drawings of the embodiments. Clearly, the embodiments in the following description are only illustrative ones, and are not all possible ones of the invention. All other embodiments obtained by those commonly skilled in the art based on the following ones without creative labor should also fall within the protection scope of the invention.

It should be noted that all directional indications (such as "upper", "lower", "left", "right", "front", "back") in the embodiments of the invention are merely used to indicate relative positional relations and moving conditions of the components referred to at a specific attitude (as shown in the figures), and once the specific attitude changes, the directional indications will change, accordingly.

In addition, the terms such as "first" and "second" in the invention are only used for the purpose of description, and do not indicate or imply relative importance or the quantity of technical features referred to. Hence, "first" or "second" may clearly or implicitly indicate the inclusion of at least one feature referred to. Moreover, the technical solutions of the embodiments can be combined by those commonly skilled in the art, and contradictory or impracticable combinations of the technical solutions should be regarded as nonexistent and will be excluded from the protection scope of the invention.

Figure 1:
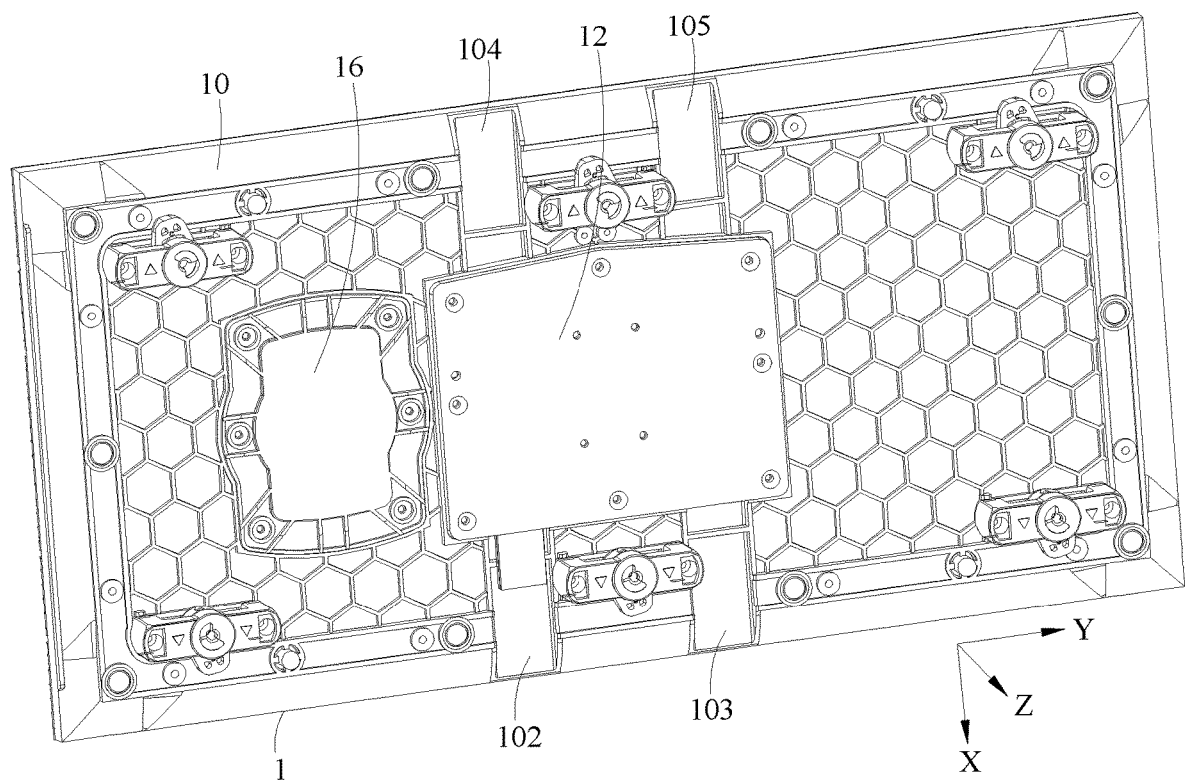
FIG. 1 is a structural view of an LED display module in one embodiment of the invention.
Figure 2:
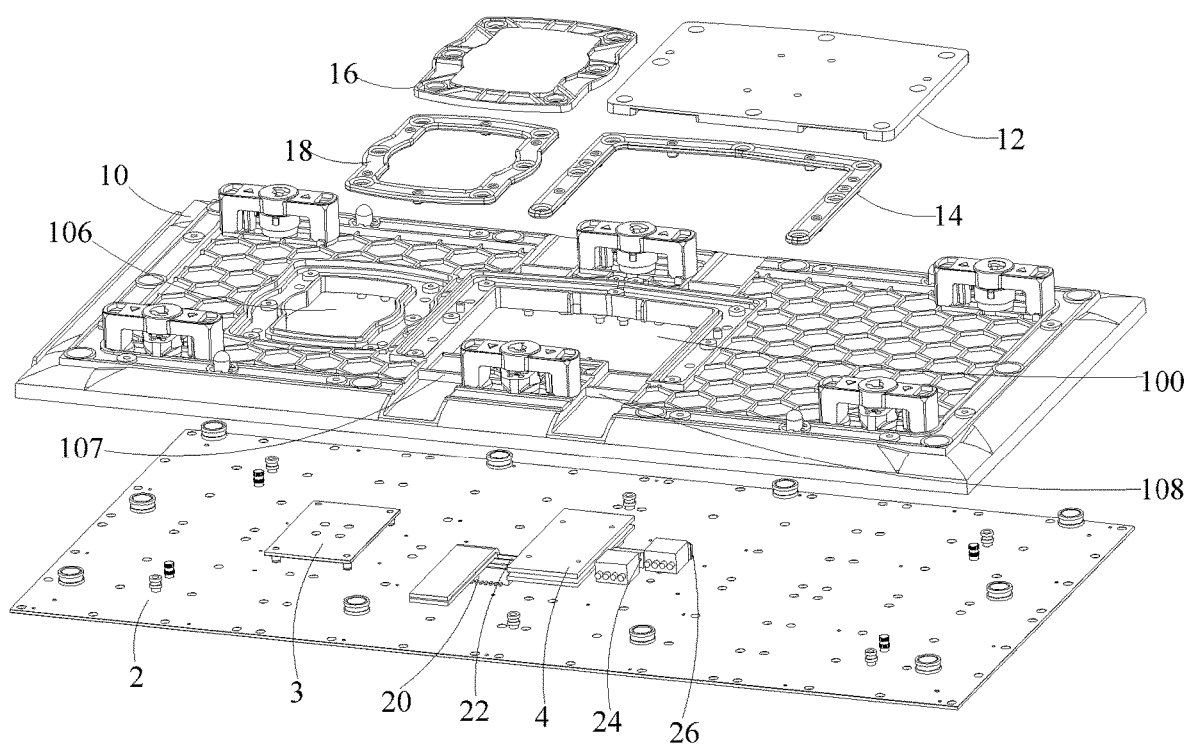
FIG. 2 is an exploded view of the LED display module in FIG. 1.
Figure 3:
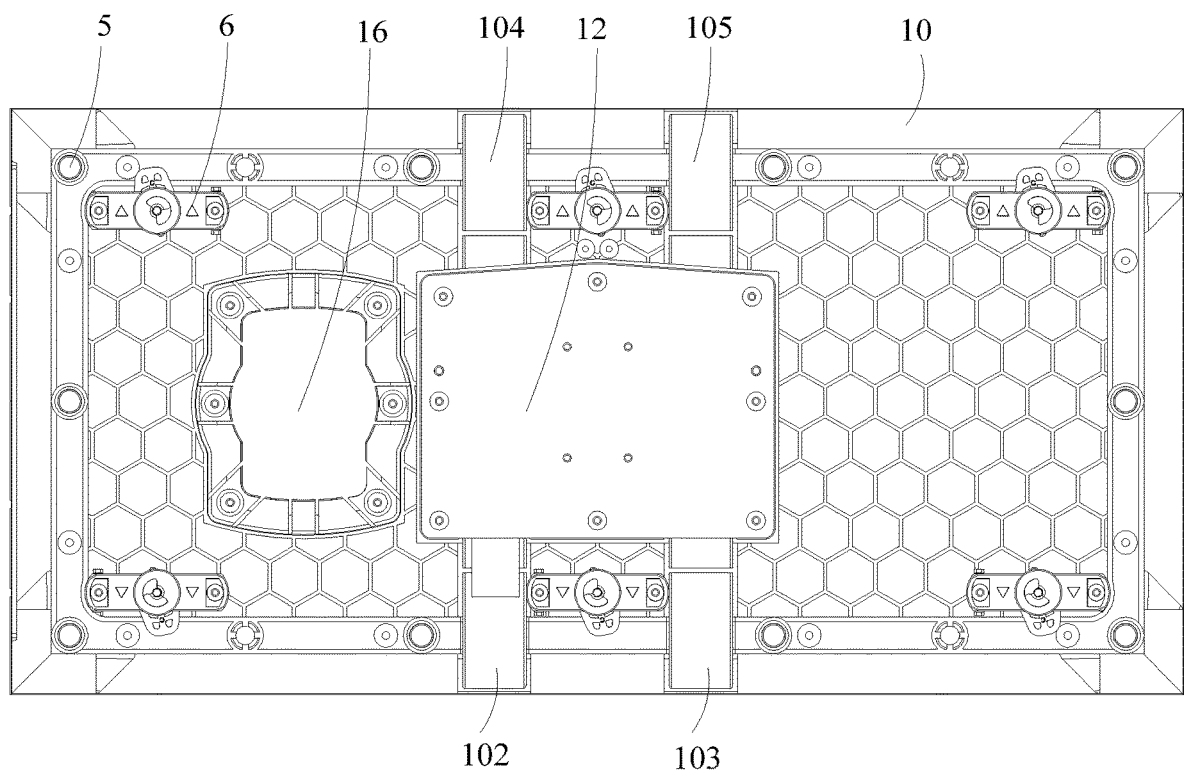
FIG. 3 is a front view of the LED display module in FIG. 1.

It should be noted that in the embodiments of the invention, based on the XYZ rectangular coordinate system established in FIG. 1, the side in the positive direction of the X-axis is defined as "upper", and the side in the negative direction of the X-axis is defined as "lower"; the side in the positive direction of the Y-axis is defined as "right", and the side in the negative direction of the Y-axis is defined as "left"; and the side in the positive direction of the Z-axis is defined as "rear" ("back"), and the side in the negative direction of the Z-axis is defined as "ahead" ("front").

The invention provides an LED display module. Referring to FIG. 1 to FIG. 4, in one embodiment, the LED display module comprises a module bottom shell 1, a circuit board 2, a receiving card 3 and a power supply 4, wherein the circuit board 2 is installed in the module bottom shell 1, and the receiving card 3 and the power supply 4 are electrically connected to the circuit board 2 and are disposed between the module bottom shell 1 and the circuit board 2. Wherein, the module bottom shell 1 comprises a shell body 10 and a first heat-dissipation cover 12 disposed over a first open region 100 of the shell body 10, the receiving card 3 is located between the shell body 10 and the circuit board 2, and the power supply 4 is located between the first heat-dissipation cover 12 and the circuit board 2.

In this embodiment, the LED display module is provided with the receiving card 3 and the power supply 4, that is, the receiving card 3 and the power supply 4 are disposed in each LED display module, so that the LED display module is made ultra-thin, and an LED displayer can be made ultra-thin, accordingly; and, the first heat-dissipation cover 12 is arranged corresponding to the power supply 4, so that heat dissipation of the power supply 4 is facilitated.

Furthermore, in this embodiment, a first wire slot 102 and a second wire slot 103 which extend downwards and are spaced from each other are disposed on the outer surface of the lower side of the first open region 100 of the module bottom shell 1. A third wire slot 104 and a fourth wire slot 105 which extend upwards and are spaced from each other are disposed on the outer surface of the upper side of the first open region 100 of the module bottom shell 1. The first wire slot 102 and the third wire slot 104 vertically correspond to each other, and the second wire slot 103 and the fourth wire slot 105 vertically correspond to each other. The module bottom shell 1 further comprises a first seal ring 14 disposed between the first heat-dissipation cover 12 and the periphery of the first open region 100, and the lower side of the first seal ring 14 is hollowed out to make room for the first wire slot 102 and the second wire slot 103.

The first wire slot 102 and the second wire slot 103 are used for downward routing, and the third wire slot 104 and the fourth wire slot 105 are used for guiding in wires from above. Wherein, the first wire slot 102 and the third wire slot 104 are used for routing a power wire or a signal wire, and the second wire slot 103 and the fourth wire slot 105 are used for routing the signal wire or the power wire. Specifically, for example, if the first wire slot 102 is used for routing the signal wire, the signal wire is guided out of the first wire slot 102, then enters the third wire slot 104 of the next LED display module, passes through the outer surface of the first heat-dissipation cover 12, and finally enters the first wire slot 102; and the power wire is guided out of the second wire slot 103, then enters the fourth wire slot 105 of the next LED display module, passes through the outer surface of the first heat-dissipation cover 12, and finally enters the second wire slot 103.

Furthermore, in this embodiment, the first seal ring 14 is U-shaped, that is, the lower end of the first seal ring 14 is entirely open. A first protrusion 107 is disposed in the first wire slot 102, a second protrusion 108 is disposed in the second wire slot 103, and the first protrusion 107 and the second protrusion 108 clamp the wires in cooperation with the first heat-dissipation cover 12 to improve the sealing performance and the waterproof performance.

Furthermore, in this embodiment, a first signal connector 20 and a second signal connector 22 which are electrically connected to the receiving card 3 are disposed on the circuit board 2, wherein one of the two signal connectors is used for inputting a signal, and the other one of the two signal connectors is used for outputting a signal. A first power connector 24 and a second power connector 26 which are electrically connected to the power supply 4 are disposed on the circuit board 2, wherein one of the two power connectors is used for inputting power, and the other one of the two power connectors is used for outputting power.

The first signal connector 20 may be electrically connected to a signal wire to input a signal, and the second signal connector 22 may be electrically connected to another signal wire to output a signal to the receiving card 3 of another LED display module, so that cascade connection of the receiving cards 3 is realized. Similarly, the first power connector 24 may be electrically connected to a power wire to input a voltage, and the second power connector 26 may be electrically connected to another power wire to output a voltage, so that cascade connection of the power supplies 4 is realized. In this embodiment, the first signal connector 20 and the second signal connector 22 are preferably sockets.

Optionally, in other embodiments, only the first signal connector 20 and the second signal connector 22 are configured, and the power supplies 4 are connected in other manners; or, only the first power connector 24 and the second power connector 26 are configured, and signal connection is realized in other manners. The connectors are not limited to the sockets, and may also be plugs.

Furthermore, in this embodiment, the first signal connector 20 and the second signal connector 22 are arranged side by side in a vertical direction and correspond to the first wire slot 102. By arranging the first signal connector 20 and the second signal connector 22 side by side in the vertical direction, the signal wire can be shortened, thus reducing the cost.

Furthermore, in this embodiment, the first power connector 24 and the second power connector 26 are arranged side by side in a vertical direction and correspond to the second wire slot 103. Similarly, by arranging the first power connector 24 and the second power connector 26 side by side in the vertical direction, the power wire can be shortened, thus reducing the cost.

Furthermore, in this embodiment, the module bottom shell 1 further comprises a second heat-dissipation cover 16, the shell body 10 has a second open region 106 corresponding to the second heat-dissipation cover 16, the second heat-dissipation cover 16 is disposed over the second open region 106, and the receiving card 3 is located between the second heat-dissipation cover 16 and the circuit board 2.

The second heat-dissipation cover 16 facilitates heat dissipation of the receiving card 3. Preferably, the first heat-dissipation cover 12 and the second heat-dissipation cover 16 are both made of die-cast aluminum to fulfill a good heat-dissipation effect.

Furthermore, in this embodiment, the LED display module further comprises a second seal ring 18 which is disposed between the second heat-dissipation cover 16 and the periphery of the second open region 106. The second seal ring 18 can improve the sealing performance between the second heat-dissipation cover 16 and the module bottom shell 1 and can fulfill good waterproof performance.

Furthermore, in this embodiment, the power supply 4 is installed on the circuit board 2 by welding or through a connector. If the power supply 4 is electrically connected to the circuit board 2 through the connector, the power supply 4 can be installed easily. Specifically, a contact pin is disposed on the bottom surface of a substrate of the power supply 4, and a pin holder is disposed on the circuit board 2, and the contact pin is inserted into the pin holder to realize electrical connection between the power supply 4 and the circuit board 2.

Furthermore, in this embodiment, the receiving card 3 is installed on the circuit board 2 by welding or through a connector. If the receiving card 3 is electrically connected to the circuit board 2 through the connector, the receiving card 3 can be installed easily. Specifically, a contact pin is disposed on the bottom surface of the receiving card 3, a pin holder is disposed on the circuit board 2, and the contact pin is inserted into the pin holder to realize electrical connection between the receiving card 3 and the circuit board 2.

Furthermore, in this embodiment, multiple magnetic parts 5 are disposed on the outer surface of the module bottom shell 1 and are used to install the LED display module on a case by means of magnetic attraction; and/or, multiple press locks 6 are disposed on the outer surface of the module bottom shell 1 and are used to install the LED display module on the case.

Either the magnetic parts 5 or the press locks 6 are adopted; or, both the magnetic parts 5 and the press locks are adopted. When the magnetic parts 5 are adopted, assembly and disassembly are easy. When the press locks 6 are adopted, front-back maintenance can be realized, assembly and disassembly are easy, and the assembly stability is good. It should be noted that the press locks 6 adopted in this embodiment belong to the prior art, and the specific structure of the press locks 6 can be appreciated with reference to Chinese Utility Model Patent Publication No. CN206136493U or Chinese Utility Model Patent Publication No. CN203490915U, and will not be detailed anymore herein. The press locks 6 are not limited to the ones shown in FIG. 1 to FIG. 4.

Particularly, in this embodiment, the multiple magnetic parts 5 are regularly distributed along the periphery of the outer surface of the module bottom shell 1, the multiple press locks 6 are also regularly distributed along the periphery of the outer surface of the module bottom shell 1, and the magnetic parts 5 are staggered with the press locks 6.

Figure 4:
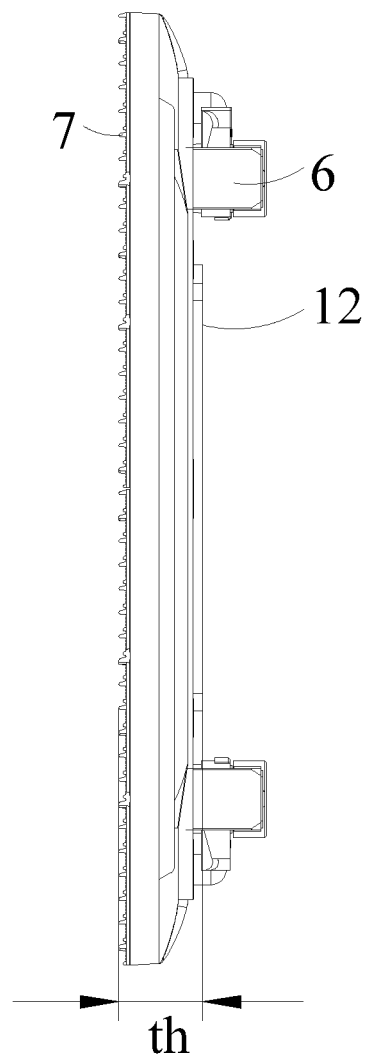
FIG. 4 is a left view of the LED display module in FIG. 1.
Figure 5:
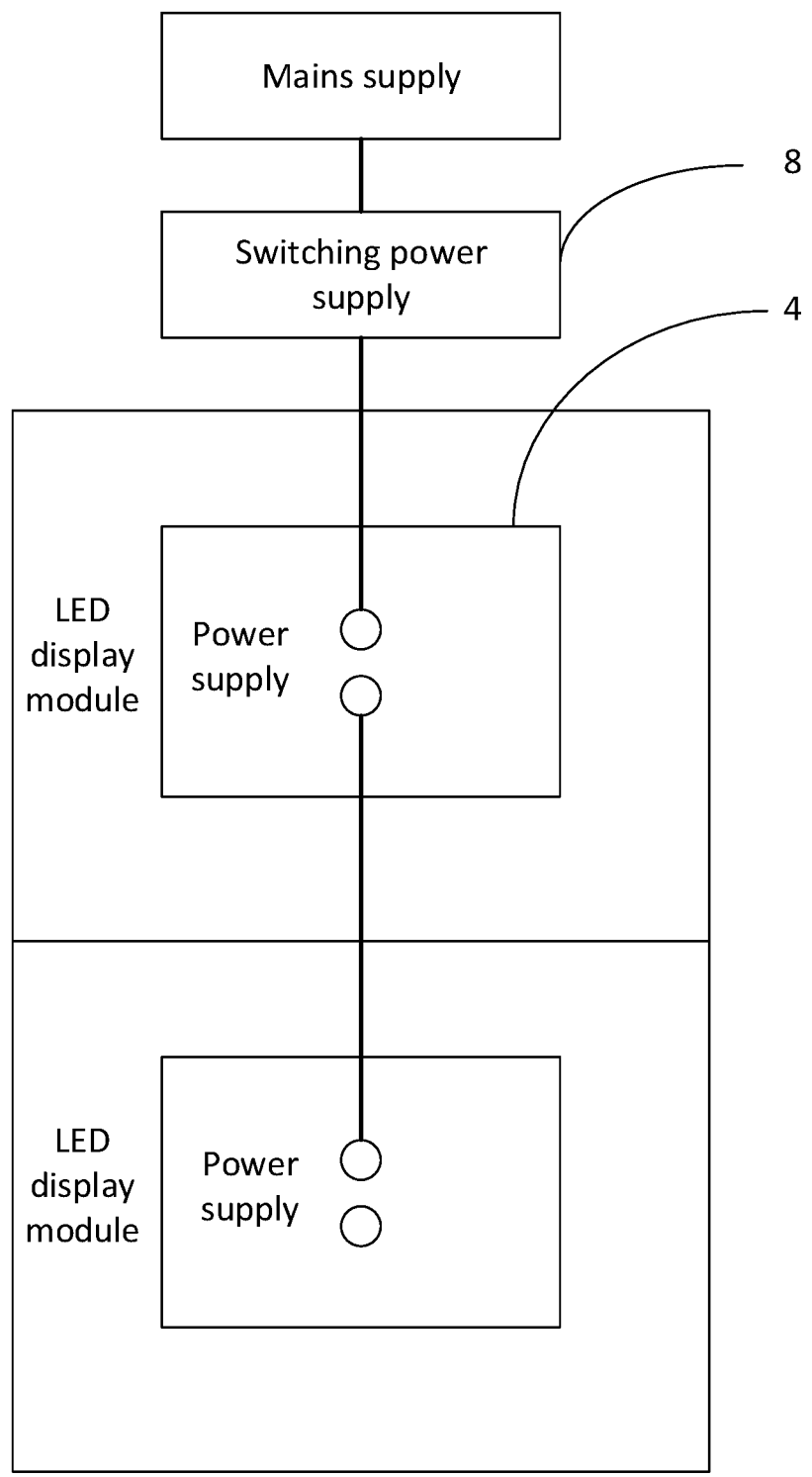
FIG. 5 is a connection diagram of power supplies of an LED displayer in one embodiment of the invention.

Furthermore, as shown in FIG. 4, the LED display module in this embodiment further comprises surface covers 7 disposed on a side, backing onto the module bottom shell 1, of the circuit board 2, wherein the thickness th of the LED display module is 8 mm-50 mm and is equal to the vertical distance from the top of each surface cover 7 to the outer surface of the first heat-dissipation cover 12. Preferably, the thickness th of the LED display module is 22 mm. Due to the fact that the press locks 6 are structural parts that are fixed to the module bottom shell 1 with nuts in the assembly process, the thickness th of the LED display module is measured without regard to the press locks 6.

In this embodiment, the power supply 4 is a DC-DC power supply for reducing a DC voltage, that is, a mains supply is processed into DC power to be accessed into the power supply 4. By means of further voltage reduction, the power requirement of the LED display module is satisfied, and a little heat is generated by the power supply 4 and can be easily dissipated. In other embodiments, the power supply 4 may be an AC-DC power supply for converting an AC voltage into a DC voltage, that is, a mains supply (AC power) is directly converted by the power supply 4 into DC power required by the LED display module.

Furthermore, in this embodiment, multiple pixel points (not shown) are disposed on the side, backing onto the module bottom shell 1, of the circuit board 2 in an array manner, and the surface covers 7 isolate the pixel points from one another, and each pixel point is a surface-mounted LED package device. In other embodiment, each pixel point may be an in-line LED package device or an in-line LED chip.

The invention further provides an LED displayer. Referring to FIG. 1 to FIG. 5, in one embodiment, the LED displayer comprises a case and at least two LED display modules installed on the case, wherein the at least two LED display modules are assembled together. The specific structure of the LED display modules can be appreciated with reference to the above embodiments. The LED displayer in this embodiment adopts all technical solutions of the above embodiments and thus has all beneficial effects achieved by the technical solutions of the above embodiments, and the details will not be given anymore herein.

Furthermore, in this embodiment, the power supplies 4 are DC-DC power supplies for reducing DC voltages. The LED displayer further comprises a switching power supply 8 for switching an AC voltage into a DC voltage, and the switching power supply 8 is electrically connected to the power supplies 4 of all the LED display modules, that is, the power supplies 4 of all the LED display modules are in cascade connection.

In other embodiments, the power supplies 4 may be AC-DC power supplies for switching AC voltages into DC voltages, that is, a mains supply (AC power) is directly accessed to the power supplies 4 without the switching power supply 8.

The above embodiments are only preferred ones of the invention, and are not intended to limit the patent scope of the invention. All equivalent structural transformations made on the basis of the contents of the specification and the accompanying drawings without deviating from the concept of the invention, or direct/indirect applications to other relating technical fields should also fall within the patent protection scope of the invention.

What is claimed is:

1. An LED display module, comprising a module bottom shell and a circuit board installed in the module bottom shell, wherein the module bottom shell comprises a shell body and a first heat-dissipation cover disposed over a first open region of the shell body;
    the LED display module further comprises a power supply and a receiving card which are electrically connected to the circuit board, wherein the power supply is located between the first heat-dissipation cover and the circuit board, and the receiving card is located between the shell body and the circuit board;
    a first wire slot and a second wire slot which extend downwards and are spaced from each other are formed in an outer surface of a lower side of the first open region of the module bottom shell, a third wire slot and a fourth wire slot which extend upwards and are spaced from each other are formed in an outer surface of an upper side of the first open region of the module bottom shell, the first wire slot and the third wire slot vertically correspond to each other, and the second wire slot and the fourth wire slot vertically correspond to each other; and
    the module bottom shell further comprises a first seal ring disposed between the first heat-dissipation cover and a periphery of the first open region, and a lower side of the first seal ring is hollowed out to make room for the first wire slot and the second wire slot.

2. The LED display module according to claim 1, wherein:
    a first signal connector and a second signal connector which are electrically connected to the receiving card are disposed on the circuit board, one of the two signal connectors is used for inputting a signal, and the other one of the two signal connectors is used for outputting a signal; and/or,
    a first power connector and a second power connector which are electrically connected to the power supply are disposed on the circuit board, one of the two power connectors is used for inputting power, and the other one of the two power connectors is used for outputting power.

3. The LED display module according to claim 2, wherein the first signal connector and the second signal connector are arranged side by side in a vertical direction and correspond to the first wire slot.

4. The LED display module according to claim 2, wherein the first power connector and the second power connector are arranged side by side in a vertical direction and correspond to the second wire slot.

5. The LED display module according to claim 1, wherein the module bottom shell further comprises a second heat-dissipation cover, the shell body has a second open region corresponding to the second heat-dissipation cover, the second heat-dissipation cover is disposed over the second open region, and the receiving card is located between the second heat-dissipation cover and the circuit board.

6. The LED display module according to claim 5, further comprising a second seal ring which is disposed between the second heat-dissipation cover and a periphery of the second open region.

7. The LED display module according to claim 1, wherein the power supply is installed on the circuit board by welding or through a connector.

8. The LED display module according to claim 1, wherein the receiving card is installed on the circuit board by welding or through a connector.

9. The LED display module according to claim 1, wherein:
    multiple magnetic parts are disposed on an outer surface of the module bottom shell and are used to install the LED display module on a case by means of magnetic attraction; and/or,
    multiple press locks are disposed on the outer surface of the module bottom shell and are used to install the LED display module on the case.

10. The LED display module according to claim 1, further comprising surface covers disposed on a side, backing onto the module bottom shell, of the circuit board, and a thickness of the LED display module is 8 mm-50 mm and is equal to a vertical distance from a top of each said surface cover to an outer surface of the first heat-dissipation cover.

11. The LED display module according to claim 1, wherein the power supply is a DC-DC power supply for reducing a DC voltage, or an AC-DC power supply for switching an AC voltage into a DC voltage.

12. An LED displayer, comprising a case and at least two LED display modules which are installed on the case and assembled together, wherein each said LED display module is the LED display module according to claim 1.

13. The LED displayer according to claim 12, wherein:
    the power supplies are DC-DC power supplies for reducing DC voltages; and
    the LED displayer further comprises a switching power supply for switching an AC voltage into a DC voltage, and the switching power supply is electrically connected to the power supplies of all the LED display modules.

14. The LED displayer according to claim 12, wherein the power supplies are AC-DC power supplies for switching AC voltages into DC voltages, and the power supply of each said LED display module is accessed to a mains supply.

15. An LED displayer, comprising a case and at least two LED display modules which are installed on the case and assembled together, wherein each said LED display module is the LED display module according to claim 1.

16. The LED displayer according to claim 15, wherein:
    the power supplies are DC-DC power supplies for reducing DC voltages; and the LED displayer further comprises a switching power supply for switching an AC voltage into a DC voltage, and the switching power supply is electrically connected to the power supplies of all the LED display modules.

17. The LED displayer according to claim 15, wherein the power supplies are AC-DC power supplies for switching AC voltages into DC voltages, and the power supply of each said LED display module is accessed to a mains supply.

18. An LED displayer, comprising a case and at least two LED display modules which are installed on the case and assembled together, wherein each said LED display module is the LED display module according to claim 5.

19. An LED displayer, comprising a case and at least two LED display modules which are installed on the case and assembled together, wherein each said LED display module is the LED display module according to claim 9.

* * * * *